(12) United States Patent
Gabriel et al.

(10) Patent No.: US 6,472,231 B1
(45) Date of Patent: Oct. 29, 2002

(54) DIELECTRIC LAYER WITH TREATED TOP SURFACE FORMING AN ETCH STOP LAYER AND METHOD OF MAKING THE SAME

(75) Inventors: Calvin T. Gabriel, Cupertino, CA (US); Lynne A. Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/770,469

(22) Filed: Jan. 29, 2001

(51) Int. Cl.[7] .................. H01L 23/48; H01L 23/52; H01L 29/40
(52) U.S. Cl. ........................... 438/9; 438/798
(58) Field of Search ................. 438/622, 687, 438/654, 618, 784, 9, 474, 485, 709, 798, 475

(56) References Cited

U.S. PATENT DOCUMENTS 6,165,891 A * 12/2000 Chooi et al. .................. 257/758
6,245,690 B1 * 6/2001 Yau et al. .................. 427/255.6
6,284,149 B1 * 9/2001 Li et al. ........................ 216/64

* cited by examiner

*Primary Examiner*—David Nelms
*Assistant Examiner*—Long K. Tran

(57) ABSTRACT

A metal interconnect arrangement provides a dielectric layer that has its upper surface treated to provide an etch stop etch stop layer. The upper surface is subjected to a plasma etch that treats, such as by carbonization, the dielectric material in a manner that alters the etch characteristics of the dielectric material. After a second dielectric layer is formed over the treated surface of the first dielectric layer, an etching may be performed through the second dielectric layer that stops on the treated surface of the first dielectric layer in a damascene interconnect process.

17 Claims, 3 Drawing Sheets

DIELECTRIC LAYER WITH TREATED TOP SURFACE FORMING AN ETCH STOP LAYER AND METHOD OF MAKING THE SAME

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metalization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metalization levels are electrically interconnected by vertically oriented conductive plugs filling via holes formed in the inter-metal dielectric layer separating the metalization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metalization to satisfy device geometry and microminiaturization requirements.

A commonly employed method for forming conductive plugs for electrically interconnecting vertically spaced metalization levels is known as "damascene"-type processing. Generally, this process involves forming a via opening in the inter-metal dielectric layer or interlayer dielectric (ILD) between vertically spaced metalization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the intermetal dielectric layer is then removed by CMP. An advantage of the dual damascene process is that contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metalization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the submicron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metalization levels.

One approach to improved interconnection paths in vias involves the use of completely filled plugs of a metal, such as W. Accordingly, many current semiconductor devices utilizing VLSI (very large scale integration) technology employ Al for the metalization level and W plugs for interconnections between the different metalization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metalization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization. Cu and Cu-based alloy metalization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractorytype metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

A response to the problem of capacitance between adjacent conductive elements caused by use of silicon oxide dielectrics has led to the use of other dielectric materials, commonly known as low-k dielectrics. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5. Still another example of a low-k dielectric material is carbon doped silicon oxide wherein at least a portion of the oxygen atoms bonded to the silicon atoms are replaced by one or more organic groups such as, for example, an alkyl group such as a methyl ($CH_3$—) group.

FIG. 8 depicts a cross-section of a metal interconnect portion formed in accordance with prior art methods of processing. On a substrate 110 a bottom etch stop layer 111 is formed. The bottom etch stop layer 111 may be made of a number of different materials, such as silicon nitride or silicon carbide. The thickness of the bottom etch stop layer 111 is typically greater than 500 Angstroms in order to provide sufficient etch stop capability. Besides being a diffusion barrier for substrate 110, the bottom etch stop layer 111 serves to protect the substrate 110 from damage during the dielectric layer etching process.

A first dielectric layer 112, which may comprise low k dielectric material, is formed over the bottom etch stop layer 111. A middle etch stop layer 114, which may comprise silicon nitride or silicon carbide, for example, is formed on the first dielectric layer 112. The thickness of this layer 114 is also normally greater than 500 Angstroms in order to provide sufficient material to protect the underlying first dielectric layer 112. The pattern of a via is formed in the middle etch stop layer 114. A second dielectric layer 116 is then formed on top of the patterned middle etch stop layer 114. Using conventional lithography and etching techniques, the second feature is etched in the second dielectric layer 116. This second feature may be a trench, for instance. The etching continues through the pattern opening in the middle etch stop layer 114 and through the first dielectric layer 112, stopping on the bottom etch stop layer 111. Following the etching of the first and second dielectric layers 112, 116, the bottom etch stop layer 111 is removed from within the via opening, thereby exposing the substrate 110. Conductive material is then filled within the openings created in the first and second dielectric layers 112, 116 to form a conductive line 118 connected to a conductive via 120. The conductive material may be copper or a copper alloy, for example. When copper is used, typically a barrier metal and a seed layer are deposited prior to the deposition of the copper.

One of the problems associated with the above-described processes and structure in the prior art is the limited choices of material for the metal etch stop layer, layer 114 in FIG. 8. The material needs to be etch resistant. A very commonly used material as an etch stop is silicon nitride, which has a dielectric constant of about 7.0. However, the use of a thick etch stop layer of silicon nitride, needed to ensure that the etching will stop on the middle etch stop layer, partially negates the benefits sought by the use of low k dielectric material. This is due to the increased combined capacitance of the etch stop layer and the dielectric layer. The same reasoning holds true for the bottom etch stop layer, layer 111 in prior art FIG. 8. Lower k materials tend to require even greater thicknesses, due to their relatively poor etch resistance qualities. Hence, the use of moderate k materials as etch stop layers mitigate the advantages achieved by low k dielectric materials.

SUMMARY OF THE INVENTION

There is a need for a method of forming a middle etch stop layer in damascene processes without requiring another material to be deposited on the dielectric layer to a thickness that overly increases the overall k value.

This and other needs are met by embodiments of the present invention which provide an interconnect arrangement comprising a dielectric layer having a lower portion of untreated dielectric material, and an upper portion of treated dielectric material. The upper portion exhibits greater etch resistance than the lower portion to the same etchant chemistry.

The use of a dielectric layer that contains an upper portion of treated (e.g., carbonized or nitrided) dielectric material allows an interconnect arrangement to be formed without the use of a separate, additional etch stop material to be deposited. In addition to reducing the number of deposition steps, the present invention allows the overall k value of the interconnect arrangement to be lowered, since typical etch stop materials have higher k values than low k dielectric materials.

The earlier stated needs are also met by embodiments of the present invention which provide a method of forming an interconnect arrangement comprising the steps of forming a first dielectric layer having an upper surface and treating the upper surface of the first dielectric layer to form etch stop material. A second dielectric layer is deposited on the treated upper surface of the first dielectric layer. A feature is etched into the second dielectric layer, with the etching stopping on the etch stop material.

The treating of dielectric material may be achieved, in certain embodiments of the invention, by exposing the dielectric material to a carbon-rich plasma at low power. This creates an etch stop layer that has a low k value, and also avoids the need for depositing a different material on the low k dielectric layer. In other embodiments, a nitrogen-rich plasma is provided that nitrides the upper surface of the dielectric layer to alter its etch characteristics.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the use of middle etch stop layers and damascene processes that employ deposited etch stop material, typically of higher k values than the surrounding dielectric layers. These problems are substantially solved by the present invention, which provides for a dielectric layer whose upper surface is treated to form etch stop material. In certain embodiments of the invention, the surface treatment includes a carbonization of the upper portion of the dielectric layer. In other embodiments the surface is nitrided. This surface treatment causes the etch resistance of the upper portion of the dielectric layer to be increased relative to the untreated lower portion of dielectric material. Hence, after the surface treatment and deposition of another dielectric layer on top of the first dielectric layer, the treated upper portion of the first dielectric layer is able to act as a middle etch stop layer. The surface treatment of the low k dielectric material does not substantially change the k value of the low k dielectric layer, so that the overall k value of the damascene arrangement is lower than arrangements in which a middle etch stop layer of higher k material is deposited over a low k dielectric layer.

Figure 1:
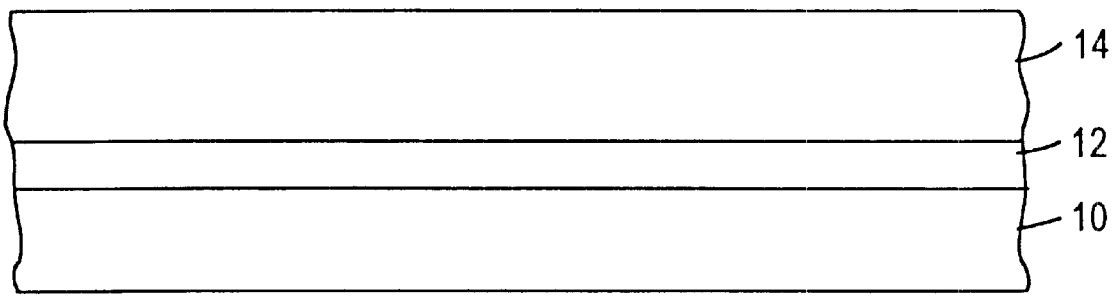
FIG. 1 is a cross-section of a portion of a metal interconnect region during one stage of the formation process in accordance with embodiments of the present invention.

FIG. 1 is a cross-section of a portion of a metal interconnect region during one stage of processing in accordance with embodiments of the present invention. In FIG. 1, a first dielectric layer 14 has been formed on a bottom etch stop layer 12. A substrate 10, underlying the bottom etch stop layer 12, is protected during etching of the first dielectric layer 14 by the bottom etch stop layer 12. Typical materials employed as an etch stop layer 12 include silicon oxynitride, silicon carbide, silicon nitride, etc. The substrate 10 may be another metallization layer, or a device layer, for example.

The first dielectric layer 14 may be any of a number of different materials. For example, the first dielectric layer may be made of a conventional oxide, organosilicate glass (OSG), or a fluorinated oxide. Lower k dielectric materials are preferred in order to lower the overall RC of the metal interconnect region. The thickness of the first dielectric layer 14 may be approximately 4,000 Angstroms.

Figure 2:
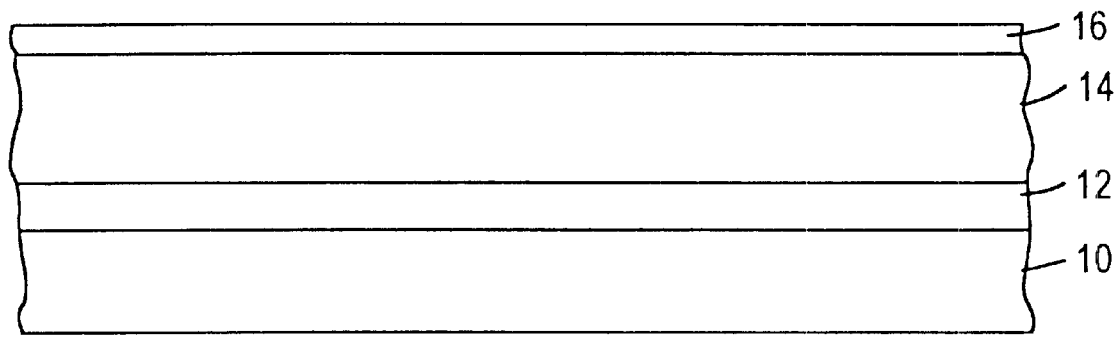
FIG. 2 shows the cross-section of FIG. 1 after the upper surface of the dielectric layer has been treated to form etch stop material in accordance with embodiments of the present invention.

After the formation of the first dielectric layer 14, conventional processing methodology deposits a middle etch stop layer over the first dielectric layer 14. However, in the present invention, the first dielectric layer 14 is treated at its upper surface to cause some of the dielectric material to form etch stop material. In certain embodiments of the present invention, the surface treatment is accomplished by exposing the dielectric material in the first dielectric layer 14 to a carbon-rich plasma at low power to cause the portion of the first dielectric layer 14 at the upper surface to carbonize. This carbonization alters the etch characteristics of the first dielectric layer 14 and creates an etch stop layer 16, as depicted in FIG. 2. The carbonized upper portion 16 may extend to a depth from the upper surface of the first dielectric layer to between about 50 to about 1,000 Angstroms. In certain embodiments of the invention, the depth of the carbonized upper portion is between about 200 to about 500 Angstroms.

A number of different reacting gases may be used to provide the surface carbonization of the first dielectric layer 14. In the following example, the gas $C_4F_8$ is described. Other fluorocarbon or hydrocarbon gases may be employed instead of $C_4F_8$. The use of $C_4F_8$ is therefore exemplary only.

In an exemplary embodiment of the surface carbonization process, the semiconductor wafer is placed in a plasma etcher, such as a Tokyo Electron, Limited Dipole Ring Magnetron (TEL DRM) plasma etcher. The exemplary process includes providing pressure at a range of about 5 to about 500 mTorr, with a preferred range between about 30 to about 50 mTorr, and with an especially preferred value of about 40 mTorr. The RF power in the plasma etcher is between about 50 to about 2,000 watts, with a preferred range of between about 300 to about 500 watts, and an especially preferred RF power of about 400 watts. The flow of the reactant gas, such as $C_4F_8$, is between about 2 to about 50 sccm, with a preferred range between about 4 to about 10 sccm, and an especially preferred flow rate of about 7 sccm. Argon (Ar) is provided to the etching chamber of the plasma etcher at a flow rate of between about 50 to about 2,000 sccm, with a preferred range of between about 250 to about 750 sccm, and an especially preferred value of about 500 sccm. The temperature is maintained in the plasma etcher at a value between about −20 to about 100° C., with a preferred range of between about 10° C. to about 40° C., and an especially preferred value of about 25° C. The first dielectric layer 14 is subjected to the plasma for between about 20 to about 300 seconds, with a preferred time of between about 30 to about 90 seconds, and with an especially preferred time of about 60 seconds.

It will be recognized by those with ordinary skill in the art that the above-described surface carbonization process parameters are exemplary only, including the preferred ranges and the especially preferred values. Other carbonization parameters may be employed without departing from the scope of the present invention.

Other types of surface treatments may also be employed. For example, the surface of the first dielectric layer 14 may be nitrided, such as when the dielectric layer 14 is silicon dioxide. An exemplary process that may be employed to convert about 50 to about 200 Angstroms of a silicon dioxide surface to silicon oxynitride (SiON) or silicon nitride (SiN), either of which will act as an etch stop, is as follows.

Employing a TEL DRM tool, for instance, the exemplary process includes providing pressure at a range of about 10 to about 500 mTorr, with a preferred range between about 50 to about 70 mTorr, and with an especially preferred value of about 60 mTorr. The RF power in the plasma etcher is between about 100 to about 2,000 watts, with a preferred range of between about 750 to about 1250 watts, and an especially preferred RF power of about 1000 watts. The flow of the reactant gas, such as $N_2$, is between about 50 to about 2000 sccm, with a preferred range between about 100 to about 300 sccm, and an especially preferred flow rate of about 200 sccm. The temperature is maintained in the plasma etcher at a value between about −20 to about 100° C., with a preferred range of between about 10° C. to about 40° C., and an especially preferred value of about 25° C. The first dielectric layer 14 is subjected to the plasma for between about 20 to about 300 seconds, with a preferred time of between about 30 to about 90 seconds, and with an especially preferred time of about 60 seconds.

Although nitridation is decribed as an alternative embodiment of a surface treatment, this should be considered exemplary only, as other types of surface treatments may be employed without departing from the scope of the invention. In the following description, the surface treatment is assumed to be carbonization for discussion purposes, although substantially the same process steps may be performed if the surface of the dielectric layer 14 is treated in a different manner, such as by nitridation. Certain process steps may be altered in a manner known to those of ordinary skill in the art to account for the different surface treatments. For example, different etchants may be used to etch the upper portion 16 depending on the surface treatment previously applied to the upper portion 16.

Figure 3:
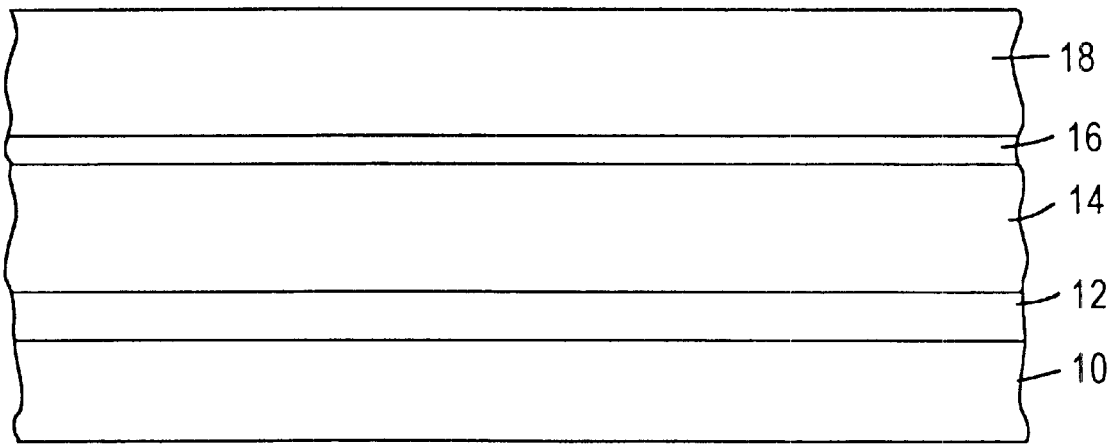
FIG. 3 shows the cross-section of FIG. 2 after a second dielectric layer has been deposited on the first dielectric layer in accordance with embodiments of the present invention.

In FIG. 3, a second dielectric layer 18 has been deposited over the first dielectric layer 14 (the lower portion) and the carbonized upper portion 16, now forming the middle etch stop layer. The second dielectric layer 18 is advantageously formed from the same material as the first dielectric layer 14. However, in certain embodiments, the second dielectric layer comprises a material that is different from the dielectric material of the first dielectric layer 14. The depth of the second dielectric layer may be about 4,000 Ångstroms, as an example.

Figure 4:
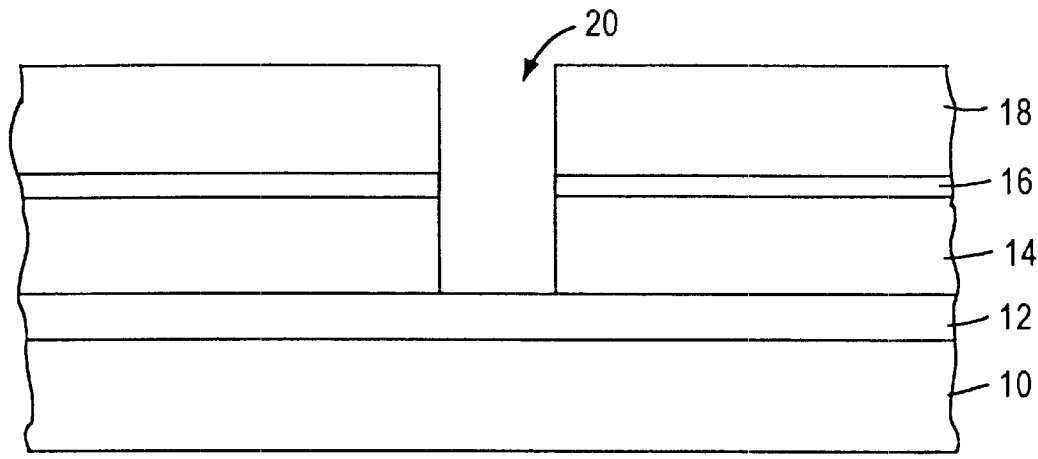
FIG. 4 depicts the portion of FIG. 3 after a feature has been etched into the first dielectric layer, through the second dielectric layer and the etch stop material, in accordance with embodiments of the present invention.

FIG. 4 depicts the portion of FIG. 3 after a first etching process is performed to create a feature in the first dielectric layer 14. The etching process is accomplished by providing a photoresist mask (not shown in FIG. 4) on the second dielectric layer 18. The photoresist mask is patterned in a conventional manner to provide an opening in the mask that corresponds to a feature to be etched into the first dielectric layer 14. In certain preferred embodiments of the present invention, the etching proceeds in a single etching step through the second dielectric layer 18, the etch stop material 16, and the first dielectric layer 14 (i.e. the untreated lower portion 14 of the dielectric layer). The etching stops at the bottom etch stop layer 12, which serves to protect the underlying substrate 10. The feature 20 formed in the first dielectric layer 14 corresponds to a via hole in the exemplary shown embodiment.

An exemplary process for etching through the second dielectric layer 18, the etch stop material 16 and the first dielectric layer 14 is performed in a plasma etcher, such as used earlier in carbonizing the surface of the first dielectric layer 14. Exemplary values for the via etch process include providing a pressure in the etching chamber of between about 5 to about 500 mTorr, with a preferred range of between about 25 to about 75 mTorr, and with an especially preferred value of about 50 mTorr. The RF power is maintained between about 500 to about 2,000 watts, with a preferred range between about 1250 to about 1750 watts, and an especially preferred RF power of about 1500 watts. The flow rate of $C_4F_8$ into the chamber is between about 5 to about 30 sccm, with a preferred flow of between about 12 to about 24 sccm, and an especially preferred flow rate of about 18 sccm. A flow of CO is provided to the chamber at a flow rate of between about 0 to about 500 sccm, with a preferred flow rate of between about 200 to about 400 sccm, and an especially preferred flow rate of about 300 sccm. The chamber is provided with $O_2$ at a flow rate of between about 0 to about 25 sccm, with a preferred range between about 0 to about 5 sccm, and an especially preferred flow rate of about 2 sccm. Argon (Ar) is provided to the chamber at the flow rate of between about 50 to about 2000 sccm, with a preferred flow rate of between about 200 to about 600 sccm, and an especially preferred flow rate of about 400 sccm . Temperature is maintained in the chamber between about −20 to about 100° C., with a preferred temperature of between about 20° C. to about 60° C., and an especially preferred temperature of about 40° C. The etch proceeds for between about 30 to about 300 seconds, with a preferred range of between about 90 to about 150 seconds, and an especially preferred duration of about 120 seconds.

The above-described process for etching through the first and second dielectric layers 14, 18 and the etch stop material 16 is exemplary only and the preferred values relate to an etching of fluorinated oxide as the dielectric material. Other process parameters may be employed depending upon the dielectric material used in the metal interconnect region.

Figure 5:
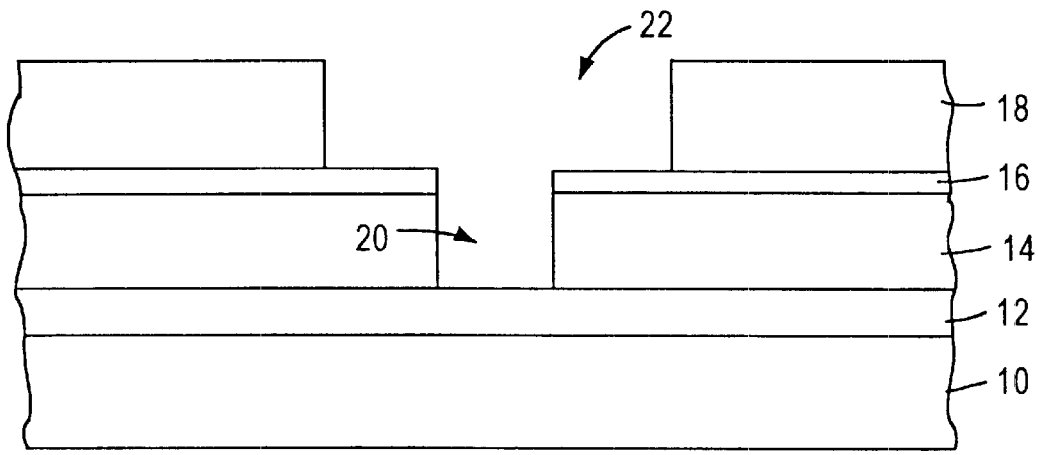
FIG. 5 shows the portion of FIG. 4 after a feature has been etched into the second dielectric layer, the etching stopping at the etch stop material in accordance with embodiments of the present invention.

Following the etching of the first feature (hereinafter referred to as the via) 20 into the first dielectric layer 14, the photoresist is removed by conventional stripping processes and a second mask is provided on the second dielectric layer 18. The second mask is patterned with features that will be etched into the second dielectric layer 18. Such a feature may be a trench for the formation of a conductive line in the second dielectric layer 18. FIG. 5 depicts the metal interconnect portion after the second dielectric layer 18 has been etched and the photoresist material has been removed. The second etching causes a trench 22 to be etched into the second dielectric layer 18. The etching is stopped by the etch stop material 16 formed at the upper portion of the first dielectric layer 14. Hence, the upper portion 16 has served as a middle etch stop layer. Again, the bottom etch stop layer 12 serves to protect the substrate 10 from the etching process.

An exemplary process for etching the trench 22 through the fluorinated oxide (an exemplary material) in second dielectric layer 18, while stopping on the etch stop material 16, is performed in a plasma etch chamber. Exemplary parameters to be employed in the trench etch process include maintaining a pressure in the chamber of between about 5 to about 500 mTorr, with a preferred range of between about 25 to about 75 mTorr, and an especially preferred value of about 50 mTorr. RF power is applied between about 300 to about 2,000 watts, with a preferred range of between about 750 to about 1250 watts, with an especially preferred value of about 1,000 watts. $C_4F_8$ is provided at a flow rate of between about 5 to about 30 sccm, with a preferred flow rate of between about 15 to about 25 sccm, and an especially preferred flow rate of about 20 sccm. A flow of CO is provided at a rate of between about 0 to about 500 sccm, with a preferred flow rate of between about 200 to about 400 sccm, and an especially preferred flow rate of about 300 sccm. The chamber is provided with Ar at a flow rate of between about 50 to about 2,000 sccm, with a preferred flow rate of between about 300 to about 500 sccm, and an especially preferred flow rate of about 400 sccm. The temperature in the chamber is maintained between about −20 to about 100° C., with a preferred temperature range between about 15° C. to about 40° C., and an especially preferred temperature of about 25° C. The etch proceeds for between about 60 to about 400 seconds, with a preferred duration of between about 120 to about 240 seconds, and an especially preferred duration of about 180 seconds.

The above process parameters are exemplary only as other parameters may be employed depending upon the dielectric material and the etchant chemistries, as well as the etching tool.

Figure 6:
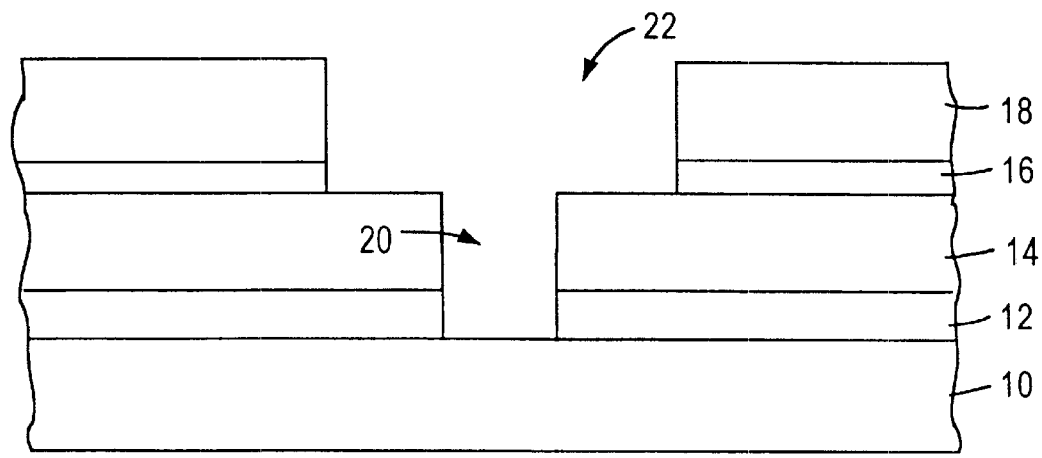
FIG. 6 shows the portion of FIG. 5 after the bottom etch stop layer has been removed within the feature formed in the first dielectric layer in accordance with embodiments of the present invention.

The bottom etch stop layer 12 is now removed, as depicted in FIG. 6, to expose the underlying substrate 10 in the via hole 20. A suitable etchant chemistry that removes silicon nitride, for example, is $CHF_3/N_2/Ar$, for example. The actual etchant chemistry employed to remove the bottom etch stop layer 12 will depend upon the particular material of the bottom etch stop layer 12 and the etch sensitivity of the first and second dielectric layers 14, 18.

Figure 7:
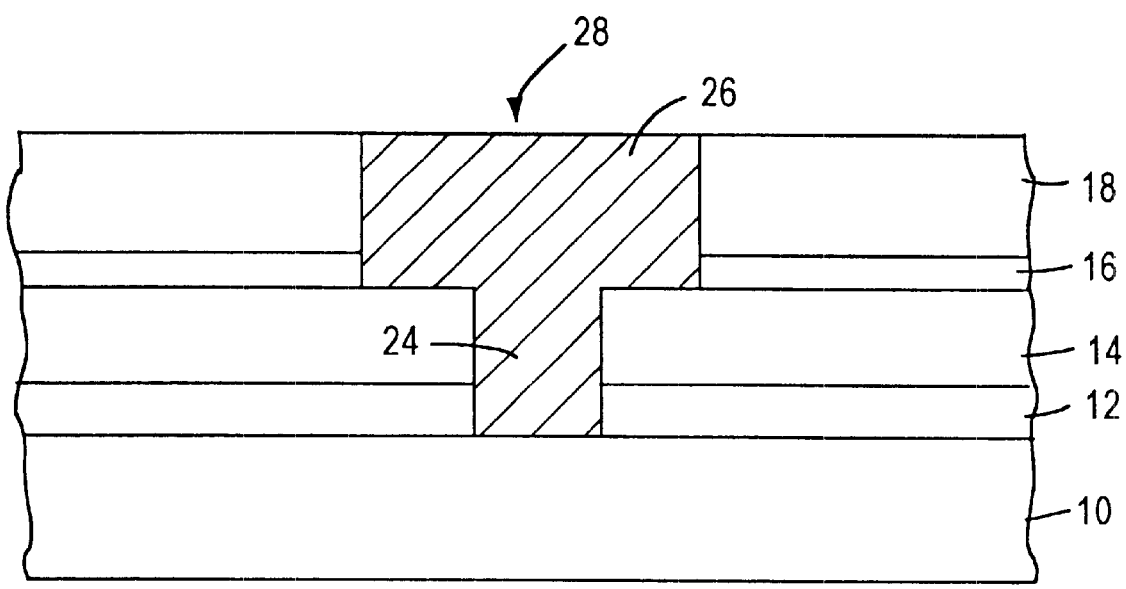
FIG. 7 depicts the portion of FIG. 6 following the deposition and planarization of conductive material within the features formed in the first and second dielectric layers in accordance with embodiments of the present invention.
Figure 8:
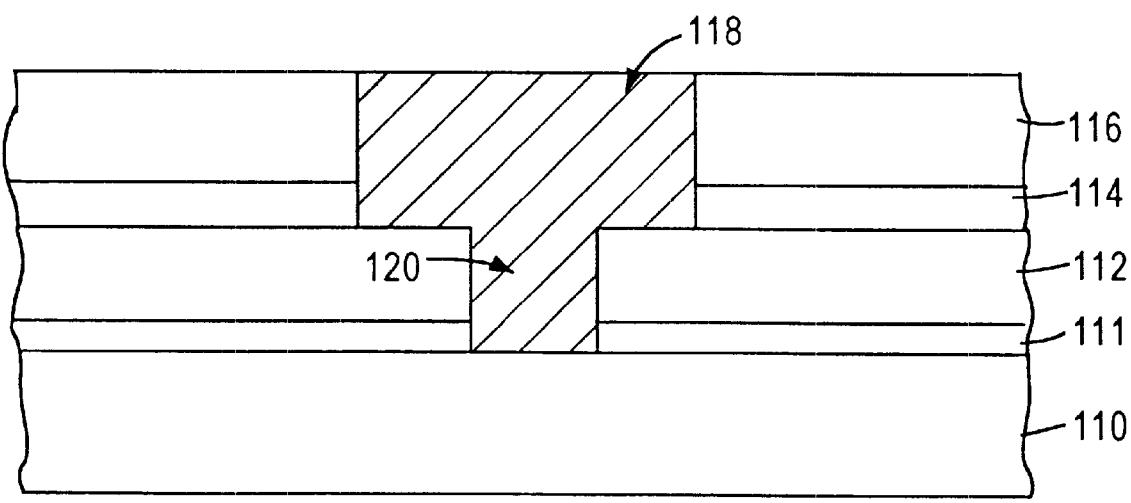
FIG. 8 depicts a metal interconnect region formed in accordance with prior art methodology.

FIG. 7 shows the middle interconnect portion after the conductive material 28 has been deposited within the trench 22 and the via 20. Simultaneous deposition may be provided in a dual damascene manner to fill the via hole 20 and trench 22. An especially preferred conductive material includes copper or a copper alloy, which may be deposited by electroless deposition or electroplating, as known to those of ordinary skill in the art. Although not depicted in FIG. 7, typically barrier material and a seed layer are deposited in the via hole 20 and the trench 22 prior to the deposition of the copper or copper alloy. After planarization, a conductive via 24 and electrically contacting conductive line 26 are provided.

The resulting metal interconnect structure exhibits a low overall k value that is improved in relation to conventional damascene arrangements that use a metal etch stop layer that is deposited with higher k material. The surface carbonization process of the present invention produces a middle etch stop layer that has a low dielectric constant, while assuring that the upper dielectric layer may be etched without compromising the integrity of the first dielectric layer.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming an interconnect arrangement, comprising the steps of:
   forming a first dielectric layer having an upper surface;
   treating the upper surface of the first dielectric layer to form etch stop material after the first dielectric layer is formed;
   depositing a second dielectric layer on the treated upper surface of the first dielectric layer; and
   etching a feature into the second dielectric layer and stopping on the etch stop material.

2. The method of claim 1, wherein the step of treating includes carbonizing the upper surface of the first dielectric layer by subjecting the first dielectric layer to a plasma employing one of a fluorocarbon gas or a hydrocarbon gas as a reactant gas.

3. A method of forming an interconnect arrangement, comprising the steps of:
   forming a first dielectric layer having an upper surface;
   treating the upper surface of the first dielectric layer to form etch stop material;
   depositing a second dielectric layer on the treated upper surface of the first dielectric layer, including carbonizing the upper surface of the first dielectric layer by subjecting the first dielectric layer to a plasma employing one of a hydrocarbon gas as a reactant gas; and
   etching a feature into the second dielectric layer and stopping on the etch stop material;
   wherein the step of subjecting the first dielectric layer to a plasma includes forming a plasma in a plasma etcher with pressure between about 5 to about 500 mToor, RF power between 50 to about 2000 W, flow of reactant gas between about 2 to about 50 sccm, Ar flow between about 50 to about 2000 sccm temperature between −20 C to about 100 C, for between about 20 to 300 seconds.

4. The method of claim 3, wherein the pressure is about 40 mTorr, the RF power is about 400 W, the flow of reactant gas is about 7 sccm, the Ar flow is about 500 sccm, the temperature is about 25 C., for about 60 seconds.

5. The method of claim 4, wherein the reactant gas is $C_4F_8$.

6. The method of claim 5, wherein the first and second dielectric layers comprise at least one of organosilicate glass, oxide or a fluorinated oxide.

7. The method of claim 6, further comprising etching a feature into the etch stop material and the first dielectric layer, said etching subjecting the first dielectric layer and the etch stop material to a plasma formed in a plasma etcher with a pressure between about 5 to about 500 mTorr, RF power between about 500 to about 2000 W, flow of $C_4F_8$ between about 5 to about 30 sccm, flow of CO between about 0 to about 500 sccm, flow of $O_2$ between about 0 to about 25 sccm, Ar flow between about 50 to about 2000 sccm, temperature between about −20 C to about 100 C, for between about 30 to about 300 seconds.

8. The method of claim 7, wherein the step of etching a feature into the second dielectric layer and stopping on the etch stop material includes subjecting the second dielectric layer to a plasma formed in a plasma etcher with a pressure between about 5 to about 500 mTorr, RF power between about 300 to about 2000 W, flow of $C_4F_8$ between about 5 to about 30 sccm, flow of CO between about 0 to about 500 sccm, Ar flow between about 50 to about 2000 sccm, temperature between about −20 C to about 100 C, for between about 60 to about 400 seconds.

9. The method of claim 8, further comprising filling the features formed in the first and second dielectric layers with conductive material.

10. The method of claim 9, wherein the conductive material is copper or a copper alloy.

11. The method of claim 10, wherein the step of etching a feature into the etch stop material and the first dielectric layer includes forming the plasma with a pressure of about 50 mTorr, RF power of about 1500 W, flow of $C_4F_8$ of about 18 sccm, flow of CO about 300 sccm, flow of $O_2$ about 2 sccm, Ar flow about 400 sccm, temperature about 40 C, for about 120 seconds.

12. The method of claim 11, wherein the step of etching a feature into the second dielectric layer and stopping on the etch stop material includes forming the plasma with a pressure of about 50 mTorr, RF power of about 1000 W, flow of $C_4F_8$ of about 20 sccm, flow of CO of about 300 sccm, Ar flow of about 400 sccm, temperature about 25 C, for about 180 seconds.

13. A method of forming an interconnect arrangement, comprising the steps of:

forming a first dielectric layer having an upper surface;

treating the upper surface of the dielectric layer to form etch stop material, including nitride in the upper surface of the first dielectric layer by subjecting the first dielectric layer to a plasma employing nitrogen gas as a reactant gas;

depositing a second dielectric layer on the treated upper surface of the first dielectric layer; and etching a feature into the second dielectric layer and stopping on the etch stop material.

14. The method of claim 13, wherein step of subjecting the first dielectric layer to a plasma includes forming a plasma in a plasma etcher with pressure between about 10 to about 500 mTorr, RF power between about 100 to about 2000 W, flow of reactant gas between about 50 to about 200 sccm, temperature between about −20 C to about 100 C, for between about 20 to about 300 seconds.

15. The method of claim 14, wherein the pressure is about 60 mTorr, the RF power is about 1000 W, the flow of reactant gas is about 200 sccm, the temperature is about 25 C, for about 60 seconds.

16. A method of forming an interconnect arrangement, comprising the steps of:

forming a first dielectric layer having an upper surface;

carbonizing the upper surface of the dielectric layer to form etch stop material by subjecting the first dielectric layer to a plasma formed in a plasma etcher with pressure between about 30 to about 50 mTorr, RF power between about 300 to about 500 W, flow of reactant gas between about 4 to about 10 sccm, Ar flow between about 250 to about 750 sccm, temperature between about 10 C to about 40 C, for between about 30 to about 90 seconds;

depositing a second dielectric layer on the carbonized upper surface of the first dielectric layer;

etching a feature through the second dielectric layer, the etch stop material and the first dielectric layer, said etching subjecting the second dielectric layer, the first dielectric layer and the etch stop material to a plasma formed in a plasma etcher with a pressure between about 25 to about 75 mTorr, RF power between about 1250 to about 1750 W, flow of $C_4F_8$ between about 12 to about 24 sccm, flow of CO between about 200 to about 400 sccm, flow of $O_2$ between about 0 to about 5 sccm, Ar flow between about 200 to about 600 sccm, temperature between about 20 C to about 60 C, for between about 90 to about 150 seconds, and etching a feature into the second dielectric layer and stopping on the etch stop material by subjecting the second dielectric layer to a plasma formed in a plasma etcher with a pressure between about 25 to about 75 mTorr, RF power between about 750 to about 1250 W, flow of $C_4F_8$ between about 15 to about 25 sccm, flow of CO between about 200 to about 400 sccm, Ar flow between about 300 to about 500 sccm, temperature between about 15 C to about 40 C, for between about 120 to about 240 seconds.

17. The method of claim 16, further comprising filling the feature in the first dielectric layer and the feature in the second dielectric layer with copper or a copper alloy.

* * * * *